United States Patent [19]
Boie

[11] Patent Number: 5,812,077
[45] Date of Patent: Sep. 22, 1998

[54] CIRCUIT FOR A/D CONVERSION OF A VIDEO RF OR IF SIGNAL

[75] Inventor: Werner Boie, Brigachtal, Germany

[73] Assignee: Thomson multimedia S.A., Courbevoie, France

[21] Appl. No.: 582,852

[22] Filed: Jan. 4, 1997

[30] Foreign Application Priority Data

Jan. 23, 1995 [EP] European Pat. Off. ............ 95400129.3

[51] Int. Cl.$^6$ ...................................................... H03M 1/06
[52] U.S. Cl. .......................... 341/118; 341/120; 341/155; 341/156
[58] Field of Search ...................................... 341/155, 156, 341/120, 118

[56] References Cited

U.S. PATENT DOCUMENTS

| | | | |
|---|---|---|---|
| 4,008,468 | 2/1977 | Imhoff et al. . | |
| 4,502,078 | 2/1985 | Steckler et al. . | |
| 4,875,048 | 10/1989 | Shimizu et al. | 341/156 |
| 4,890,107 | 12/1989 | Pearce | 341/156 |
| 4,903,023 | 2/1990 | Evans et al. | 341/120 |
| 5,105,194 | 4/1992 | Mizunoue et al. | 341/156 |
| 5,353,027 | 10/1994 | Vorenkamp et al. | 341/156 |

FOREIGN PATENT DOCUMENTS

| | | |
|---|---|---|
| 0321681 | 6/1989 | European Pat. Off. . |
| WO-A-90-03066 | 3/1990 | WIPO . |

OTHER PUBLICATIONS

Electronic Design, 24 Oct. 1991, Hasbrouck Heights, NJ USA pp. 47–59, XPooo265950 Goodenough, F. "12 Bit IC ADCs Sample Signals At Up To 20 MHz" COpy search report.

*Primary Examiner*—Jeffrey A. Gaffin
*Assistant Examiner*—Jason L. W. Kost
*Attorney, Agent, or Firm*—Joseph S. Tripoli; Frederick A. Wein

[57] ABSTRACT

There is disclosed an A/D conversion circuit comprising a first A/D converter for receiving an input signal of the A/D conversion circuit and providing a digital output signal, the first A/D converter having a restricted resolution, wherein the input signal passes through delay means to a first input of a subtraction stage. A first D/A converter operating on the output signal of the first A/D converter generates an analog output signal and feeds the analog output signal via an adding stage to a second and subtracting input of the subtraction stage, wherein the input signal of the first D/A converter passes through a correction algorithm unit to a second D/A converter. The output signal of the second D/A converter is fed to a second input of the adding stage, wherein the correction algorithm unit provides empirically determined data for D/A conversion correction. A low pass filter coupled to the output of the subtraction stage provides a low pass filtered and amplified output signal. A sample-and-hold circuit then passes the low pass filtered and amplified output signal of the subtraction stage to the input of a second A/D converter, wherein the first A/D converter and the first D/A converter are controlled by a clock having a frequency which is substantially greater than the frequency of another clock which controls the sample-and-hold circuit and the second A/D converter. A summing stage sums the output signals of the first and second A/D converters to form an output signal of the A/D conversion circuit.

4 Claims, 3 Drawing Sheets

CIRCUIT FOR A/D CONVERSION OF A VIDEO RF OR IF SIGNAL

FIELD OF THE INVENTION

The invention relates to a circuit for A/D conversion according to the introductory part of claim 1.

BACKGROUND OF THE INVENTION

The application of digital signal processing techniques in TV receiver design, especially for analogue to digital conversion of RF and IF signals in the tuner, gets increasing importance. On the other hand due to the high frequency of said signals there are very strong requirements especially with respect to a high sampling frequency and a high dynamic resolution in the region of 12 bits and 25 MHz. Taking into account the worst case reception of a desired signal having an IF amplitude inferior of 50 to 60 dB with respect of the superimposed adjacent channel signals the required dynamic resolution amounts to about 20 bits. In addition to that the IF signal as it can be encountered in TV sets has also to be sampled at 80 MHz at least.

In order to meet said requirements by using hardware in the form of low cost A/D converters a so-called two-step A/D conversion was proposed. Within such a circuit the incoming analogue IF signal is fed via a sample and hold circuit to a first A/D converter with a restricted dynamic resolution. The output of said A/D converter is fed via a D/A converter to a subtracting stage fed on the other hand with the output of said sample and hold circuit. Output of said subtracting stage is fed via a second sample and hold circuit to a second A/D converter with higher dynamic resolution. Outputs of said first A/D converter and said second A/D converter are then combined in a summing stage the output of which is used as the final digized IF or RF signal. Such a circuit is described in "Electronic Design" Oct. 24, 1991, pages 47–59.

SUMMARY OF THE INVENTION

It is an object of the invention to simplify such a circuit and to enable application of low cost A/D converters. According to one embodiment of the invention a digital adaptive calibration offers new possibilities for hardware components with virtually higher accuracy.

The invention relates to a circuit for A/D conversion of a video RF or IF signal in a TV receiver or a video recorder wherein the input terminal is connected on the one hand via a first A/D converter of restricted dynamic resolution and on the other hand via a subtracting stage and a second A/D converter to inputs of a summing stage the output of said first A/D converter being connected via a D/A converter to a second input of said subtracting stage.

According to the invention there is inserted between said input terminal and said subtracting stage an analogue delay unit.

According to a first embodiment of the invention the output of said subtracting stage is connected via a series circuit, a low pass filter, a sample and hold circuit and a second A/D converter to the input of said summing stage. Preferably a correction algorithm unit is provided having its input connected to input of said first D/A converter and having it's output connected via a second D/A converter to the input of an adding stage inserted between output of said first D/A converter and input of said subtracting stage.

According to a second embodiment of the invention output of said first A/D converter is connected on the one hand via a model of an usually used D/A converter and on the other hand via an ideal D/A converter to inputs of a second subtracting stage having its output connected to said summing stage.

According to a further embodiment of the invention a test signal in an unoccupied frequency region of the signal to be digitised is inserted into the signal and is used for a permanent adaptive calibration of said D/A converter.

Said first A/D converter and said D/A converter are both controlled by a clock signal having an increased clock rate substantially higher than the normal clock rate used for the complete circuit.

In order that the invention may be better understood some examples of the invention are now described in combination with the accompanying drawing. Within the drawing

DETAILED DESCRIPTION OF THE INVENTION

Figure 1:
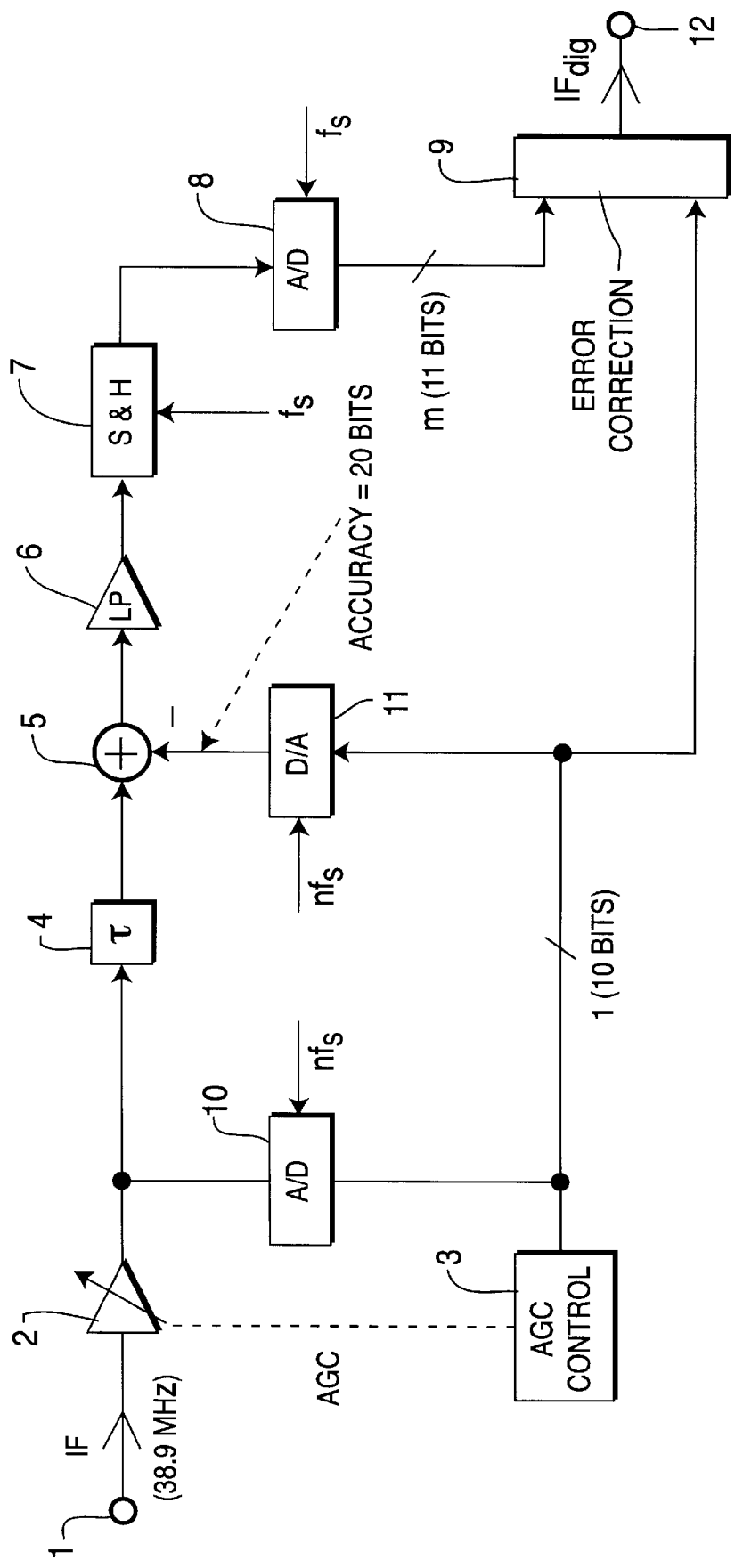
FIG. 1 is a block diagram of an A/D conversion circuit for an IF TV signal incorporating the present invention.

In FIG. 1 the incoming IF TV signal is fed from terminal 1 to controllable amplifier 2 which is controlled in it's amplification factor by AGC circuit 3. Amplification of amplifier 2 is controlled in such a way that within the succeeding stages the input signals will fully exploit the available dynamic ranges. In circuits according to prior art a sample and hold circuit is connected to the output of amplifier 2. This circuit is omitted here and replaced by an analogue delay unit 4 having its output connected to adding stage 5. Output voltage from amplifier 2 is also fed to a first A/D converter 10 having a restricted dynamic resolution of 1 bits, number of bits possibly might be 10 bits. Digital output signal from converter 10 is fed via D/A converter 11 to input of subtracting stage 5 and therein subtracted from the IF signal provided by amplifier 2 and delayed by delay unit 4. The resulting difference signal at the output of subtracting stage 5 passes through band limiting amplifier 6 with an amplification factor of $2^1$ and goes into a sample and hold circuit 7 fed by clock signal fs. Circuit 7 serves for second A/D conversion within A/D converter 8. Said converter 8 also has 1 bits resolution or even more for error correction. In order not to use a further sample and hold circuit between input of A/D converter 10 and output of D/A converter 11 these converters should run with an increased clock rate nfs. The outputs of A/D converter 10 and A/D converter 8 are both fed to summing stage 9 providing at its output terminal 12 the final digitised IF signal.

In order to make analogue delay unit 4 as simple as possible its delay time is kept a minimum by driving the A/D converter 10 and the D/A converter 11 with a maximum clock rate nfs.

In the following error correction of the signals will be more fully described. The error of a D/A converter is the difference between the actual analogue output and the output that is expected when a given digital code is applied to said converter. Sources of differences are given by gain error, zero error, linearity errors and noise. The latter, i.e. the internally generated random noise is not a major factor in D/A converters. Of much greater importance in D/A converters are interferences in the form of high amplitude low energy spikes appearing at the D/A converters output caused by coupling of digital signals in surprising variety of ways. However, this difficulty is substantially decreased in the circuit according to FIG. 1 in which sample and hold circuit 7 is provided in front of second A/D converter 8. As for the gain error an appropriate power supply should be made available considering the demanded logic levels and analogue output signals to be employed into this architecture. The offset error shows principally the same dependency of the supply voltage as the gain error does because for almost all bipolar converters instead of actually generating negative currency to correspond to negative numbers as a unipolar D/A converter is used and the output is offset by half a MSB. With respect to the linearity any two adjacent digital codes should result in measured output values that are exactly one LSB apart. Any deviation of the measured step from the ideal difference is called differential non-linearity express in sub multiples of one LBS. The differential non-linearity is usually caused by the tolerances of the resistors in the D/A converter. An accuracy of about 12 bits can be achieved by including laser trimmable thin film resistor.

Figure 2:
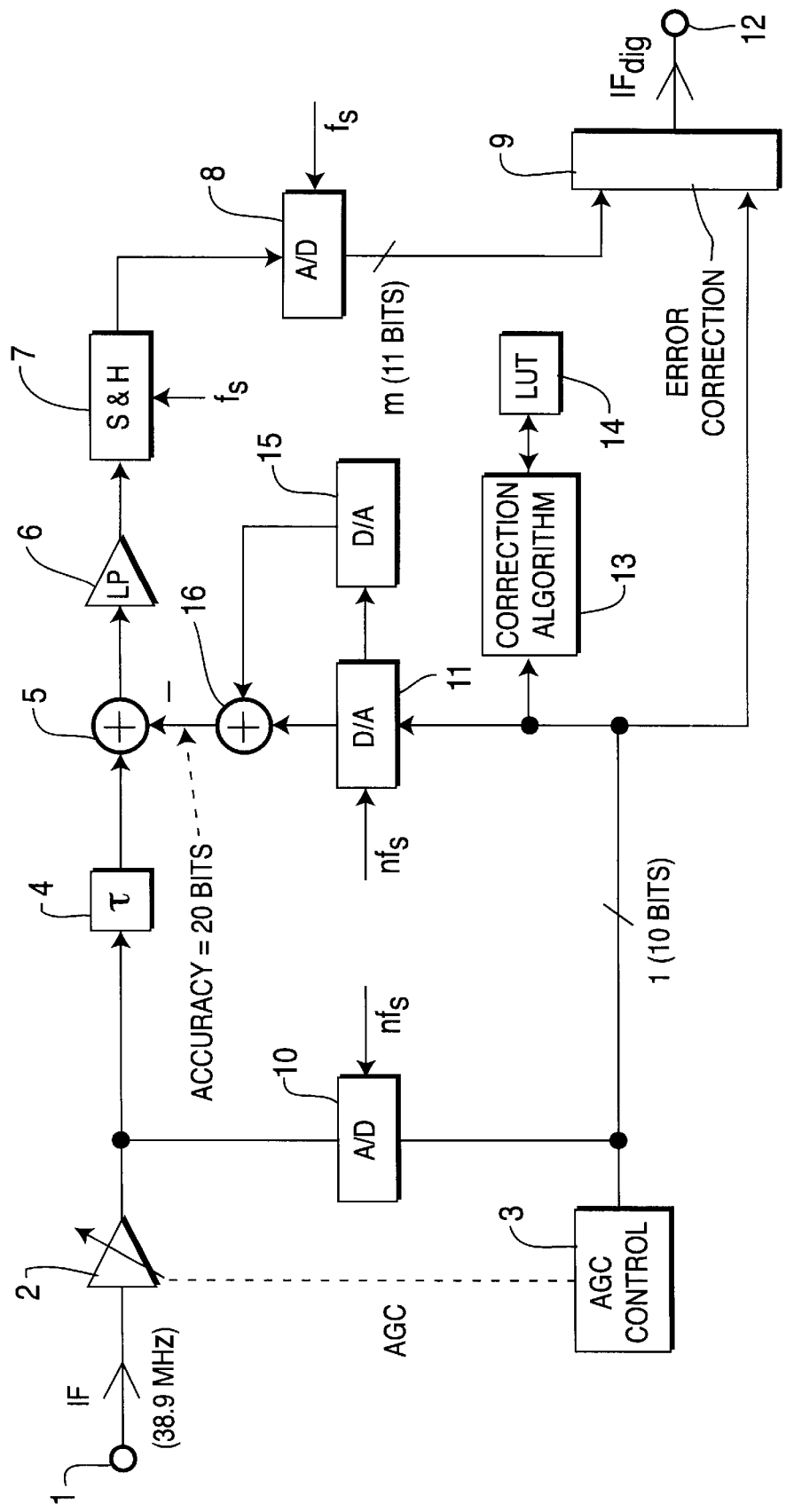
FIG. 2 is a block circuit for said first embodiment of the invention and FIG. 3 is a block diagram for said second embodiment of the invention.

FIG. 2 shows an embodiment of the invention additionally including error correction. Digital input signal fed to D/A converter 11 additionally is fed to correction algorithm unit 13. This algorithm is based on empirically determined data stored in a look-up table (LUT) 14. Output of unit 13 is fed to input of a second D/A converter 15 having its output connected to input of an adding stage 16 inserted between output of D/A converter 11 and input of subtracting stage 5. Unit 13 drives D/A converter 15 with an accordingly reduced voltage reference compared to the main D/A converter 11. Within stage 16 the analogue correction signal from D/A converter 15 is added to the output of main D/A converter 11 thus allowing the application of a D/A converter with reduced accuracy.

Figure 3:
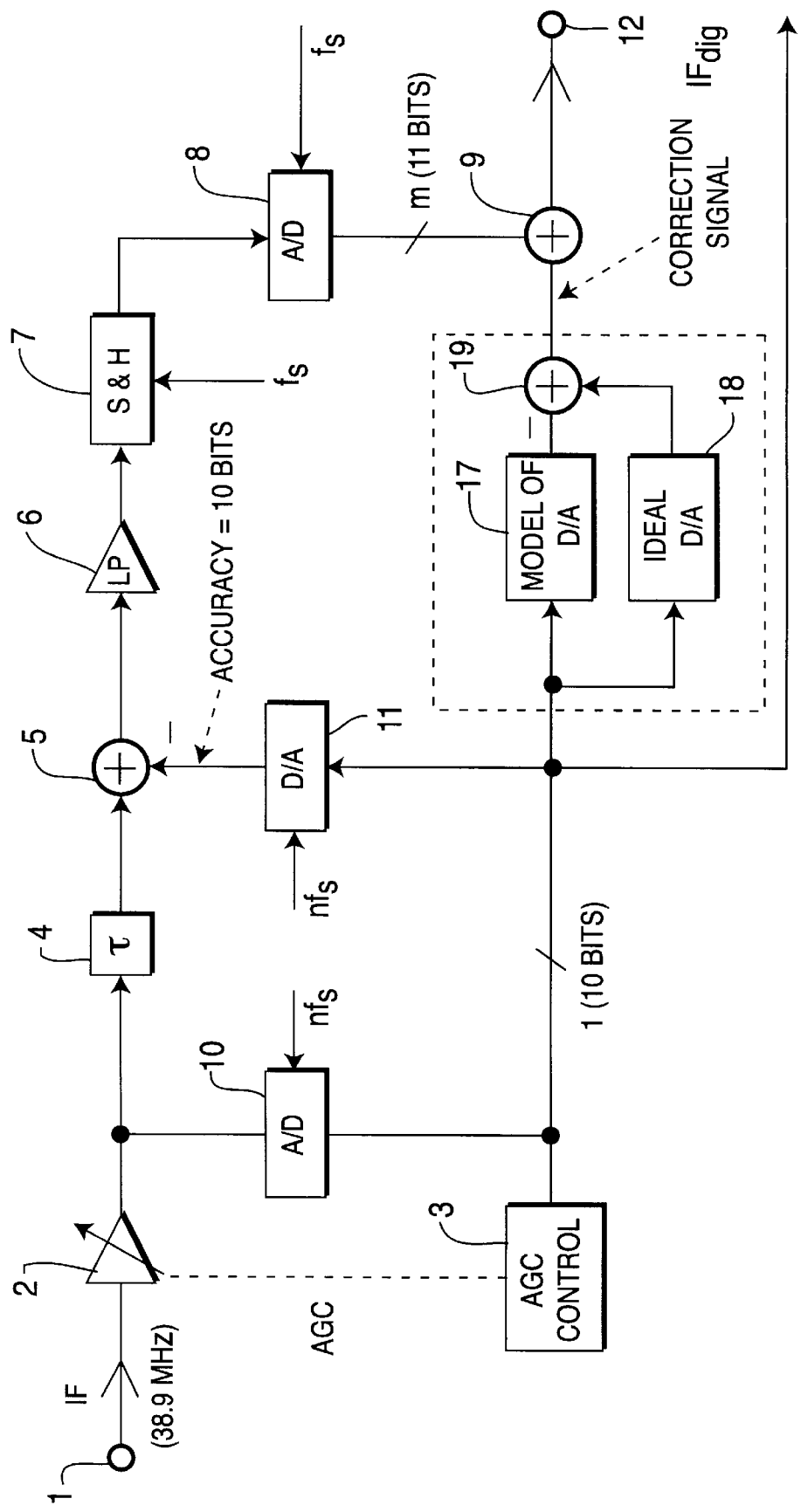

FIG. 3 shows another embodiment of the invention using a digital correction. The correction algorithm consists in principle in a D/A converter 17 being a model of a normally used converter taking into account the empirically measured errors of the D/A converter. Additionally an ideal D/A converter 18 is provided. Both converters 17, 18 are fed with the digital output signal of A/D converter 10. Outputs of D/A converters 17 and 18 are fed to a subtracting stage 19. Output of said stage 19 is a difference of said signals representing the correction signal which is added to the output signal of second A/D converter 8 within summing stage 9.

It is also possible to provide a permanent adaptive calibration of the digital analogue converter model 17 by inserting a test signal in an unoccupied frequency region of the IF signal to be digitised. A sinusoidal signal will do that already and will also allow easy evaluation of the necessary data. This feature would be very welcome if also temperature dependent data have to be evaluated.

The achievable high dynamic range of the proposed A/D conversion architecture would permit to eliminate the SAW-filter in the current analogue IF module, this making free the way for a fully integrated digital IF solution, prefeably on one single chip.

I claim:

1. A/D conversion circuit comprising:
a first A/D converter for receiving an input signal of said A/D conversion circuit and providing a digital output signal, said first A/D converter having a restricted resolution, and wherein the input signal passes through delay means to a first input of a subtraction stage;

a first D/A converter operating on the output signal of said first A/D converter to generate an analog output signal and providing the analog output signal via an adding stage to a second and subtracting input of said subtraction stage, wherein the input signal of said first D/A converter passes through a correction algorithm unit to a second D/A converter, the output signal of which is fed to a second input of said adding stage, and wherein said correction algorithm unit provides empirically determined data for D/A conversion correction;

a low pass filter coupled to the output of said subtraction stage to provide a low pass filtered and amplified output signal;

a sample-and-hold circuit which passes the low pass filtered and amplified output signal of said subtraction stage to the input of a second A/D converter, wherein said first A/D converter and said first D/A converter are controlled by a clock having a frequency which is substantially greater than the frequency of another clock which controls said sample-and-hold circuit and said second A/D converter;

a summing stage in which from the output signals of said first and second A/D converters, an output signal of said A/D conversion circuit is formed.

2. A/D conversion circuit comprising:
a first A/D converter for receiving an input signal of said A/D conversion circuit and providing a digital output signal, said first A/D converter having a restricted resolution, and wherein the input signal passes through delay means to the first input of a subtraction stage;

a D/A converter operating on the output signal of said first A/D converter to generate an analog output signal and providing the analog output signal to a second and subtracting input of said subtraction stage, wherein the input signal of said D/A converter is also input to a unit which provides empirically determined D/A conversion data taking into account the difference between an ideal D/A converter output signal and a usual D/A converter output signal;

a low pass filter coupled to the output of said subtraction stage to provide a low pass filtered and amplified output signal;

a sample-and-hold circuit which passes the low pass filtered and amplified output signal of said subtraction stage to the input of a second A/D converter, wherein said first A/D converter and said D/A converter are controlled by a clock having a frequency which is substantially greater than the frequency of another clock which controls said sample-and-hold circuit and said second A/D converter;

a summing stage in which from the output of said unit providing empirically determined D/A conversion data and said second A/D converter, an output signal of said A/D conversion circuit is formed.

3. Circuit according to claim 1 or 2, wherein said conversion circuit input signal includes a test signal in an unoccupied frequency region of the conversion circuit input signal inserted into said input signal in order to perform a permanent adaptive calibration of the D/A conversion.

4. Circuit according to claim 3, wherein said test signal is a sinusoidal test signal.

* * * * *